United States Patent [19]

Steinbach et al.

[11] Patent Number: 5,408,194
[45] Date of Patent: Apr. 18, 1995

[54] ADAPTIVE ANALOG MINIMUM/MAXIMUM SELECTOR AND SUBTRACTOR CIRCUIT

[75] Inventors: Günter Steinbach, Sunnyvale; Timothy P. Allen, Los Gatos; Carver A. Mead, Pasadena, all of Calif.

[73] Assignee: Synaptics, Incorporated, San Jose, Calif.

[21] Appl. No.: 83,905

[22] Filed: Jun. 25, 1993

[51] Int. Cl.⁶ .............................................. H03K 5/24
[52] U.S. Cl. ...................................... 327/62; 327/355
[58] Field of Search ............... 307/529, 498, 491, 353, 307/358, 362, 351, 350, 355, 494; 328/158, 152, 103, 159

[56] References Cited

U.S. PATENT DOCUMENTS

| | | | |
|---|---|---|---|
| 4,142,116 | 2/1979 | Hardy, Jr. et al. | 307/362 |
| 4,691,125 | 9/1987 | Rybicki | 307/353 |
| 4,857,768 | 8/1989 | Griffith et al. | 307/355 |
| 4,890,014 | 12/1989 | Ramet | 307/355 |
| 4,943,736 | 7/1990 | Kihara et al. | 307/491 |
| 5,175,451 | 12/1992 | Ihara | 307/355 |

*Primary Examiner*—Timothy P. Callahan
*Assistant Examiner*—Dinh Le
*Attorney, Agent, or Firm*—D'Alessandro, Frazzini & Ritchie

[57] ABSTRACT

A circuit for use as a channel of a minimum selector and subtractor circuit includes a P-Channel MOS transistor having a gate connected to an input node, a source connected to the output of a current source, and a drain connected to a fixed voltage source. The source of the P-Channel transistor is connectable to a common conductive line through a first switch. The source of the P-Channel transistor is also connected to the non-inverting input of a transconductance amplifier. The inverting input of the transconductance amplifier is connected to a first plate of a capacitor. The second plate of the capacitor is connected to a fixed voltage source such as ground. The output of the transconductance amplifier is connectable to its inverting input through a second switch. The output of the transconductance amplifier forms the output of the minimum selector and subtractor circuit. A plurality of individual channel circuits may all be connected to the common conductive line. The input nodes of the individual channel circuits are each individually connected to a different one of a plurality of analog input lines. The minimum selector and subtractor circuit determines the minimum analog value appearing on the plurality of lines and subtracts that value from the input values on all of the input lines. A maximum selector and subtractor circuit is formed by reversing transistor types.

4 Claims, 8 Drawing Sheets

ADAPTIVE ANALOG MINIMUM/MAXIMUM SELECTOR AND SUBTRACTOR CIRCUIT

BACKGROUND OF THE INVENTION

1. Field of The Invention

The present invention relates to electronic discrete-time (sampled) analog signal processing circuits, particularly those circuits that process multiple signal channels in parallel, more particularly in applications where the quantity of interest is not the absolute signal voltage on any one channel but the difference between each channel and some common baseline.

2. The Prior Art

There are many applications where it is desirable to examine the voltages or currents present on a plurality of signal lines, and to make decisions or perform some signal processing based upon the knowledge of which of the plurality of signals is of the highest or lowest magnitude. Numerous circuits are known which evaluate the magnitudes of signals appearing on a plurality of signal lines and perform a defined function in response to the identification of the signal line bearing the signal of interest. For example, a "winner-take-all" circuit is described in U.S. Pat. No. 5,059,814. An adaptable winner-take-all circuit is described and claimed in U.S. Pat. No. 5,146,106 to Anderson et al.

An electronic analog minimum and maximum detectors are disclosed and claimed in co-pending application Ser. No. 07/895,934, filed Jun. 8, 1992, entitled Object Position Detector, assigned to the same assignee as the present invention.

A Monolithic Sixteen Channel Analog Array Normalizer is described by Gilbert in Journal of Solid State Circuits, Vol. SC-19, No. 6, 1984. This circuit may be used to scale voltages to a common range.

BRIEF DESCRIPTION OF THE INVENTION

The minimum selector and subtractor circuits and maximum selector and subtractor circuits of the present invention are sampled-data systems with two distinct phases of operation. In a first phase of operation, they determine the minimum or maximum analog signal from among a plurality of analog signals on a plurality of signal lines. In a second phase of operation, they subtract this minimum or maximum signal value from the signals on all of the signal lines.

According to a first aspect of the present invention, a circuit for use as an individual channel of a minimum selector and subtractor circuit includes a P-Channel MOS transistor having a gate connected to an input node, a source connected to the output of a current source, and a drain connected to a fixed voltage source such as ground. The source of the P-Channel transistor is connectable to a common conductive line through a first switch. The source of the P-Channel transistor is also connected to the non-inverting input of a transconductance amplifier. The inverting input of the transconductance amplifier is connected to a first plate of a capacitor. The second plate of the capacitor is connected to a fixed voltage source such as ground. The output of the transconductance amplifier is connectable to its inverting input through a second switch. The output of the transconductance amplifier forms the output of the minimum selector and subtractor circuit. The first and second switches may comprise CMOS pass gates as is known in the art, or may comprise other electrical or mechanical switch elements.

According to a second aspect of the invention, a minimum selector and subtractor circuit comprises a plurality of individual channel circuits according to the present invention. The individual channel circuits are all connected to the common conductive line. The input nodes of the individual channel circuits are each individually connected to a different one of a plurality of analog input lines. The minimum selector and subtractor circuit determines the minimum analog value appearing on the plurality of lines and subtracts that value from the input values on all of the input lines.

During a first, or minimum-storage phase, the minimum selector and subtractor circuit is configured to compute the minimum signal level of multiple channels by closing the first and second switches of each of its channels. During this operating phase, each of the transconductance amplifiers are configured as unity-gain voltage followers which store the aforementioned minimum voltage on storage capacitors in each individual channel circuit.

During a second, or minimum subtraction phase, the P-Channel MOS transistors of each channel circuit are configured as voltage followers which present the channel input voltages to the non-inverting inputs of the transconductance amplifies. At the same time, the inverting inputs of the transconductance amplifiers receive the aforementioned stored minimum voltage. During this phase of operation, the transconductance amplifiers are configured as open-loop transconductors and produce output currents that are substantially proportional to the differences of channel input voltages and the stored common minimum voltages.

According to an alternate embodiment of the minimum selector and subtractor circuit of the present invention, the drain of the P-Channel MOS transistor of each channel is connected to the drain of an N-Channel MOS current-limiting transistor and the source of the N-Channel MOS transistor is connected to the fixed voltage source. The gate of the N-Channel MOS transistor is connected to a source of current-limit bias voltage. In this embodiment of the invention, the circuit selects, stores, and subtracts not the absolute minimum of the channel input voltages but the average of several of the lowest channel input voltages, thus attenuating the effects of input noise on the minimum selection.

According to a third aspect of the invention, a circuit for use as an individual channel in a maximum selector and subtractor circuit is formed by replacing the P-Channel MOS transistor with an N-Channel MOS transistor and by reversing the power supply polarities of the minimum selector and subtractor circuit. This circuit may be modified to include a P-Channel MOS transistor to compute the average of several of the highest channel input voltages, thus attenuating the effects of input noise on the maximum selection.

According to a fourth aspect of the present invention, a maximum selector and subtractor circuit comprises a plurality of individual maximum selector and subtractor channel circuits according to the present invention. The individual channel circuits are all connected to the common conductive line. The input nodes of the circuits are each individually connected to a different one of a plurality of analog input lines. The maximum selector and subtractor circuit determines the maximum analog value appearing on the plurality of lines and subtracts that value from the input values on all of the input lines.

During a first, or maximum-storage phase, the maximum selector and subtractor circuit is configured to compute the maximum signal level of multiple channels by closing the first and second switches of each of its channels. During this operating phase, each of the transconductance amplifiers are configured as unity-gain voltage followers, which store the aforementioned maximum voltage on storage capacitors in each individual channel circuit.

During a second, or maximum subtraction phase, the N-Channel MOS transistors of each channel circuit are configured as voltage followers which present the channel input voltages to the non-inverting inputs of the transconductance amplifies. At the same time, the inverting inputs of the transconductance amplifiers receive the aforementioned stored maximum voltage. During this phase of operation, the transconductance amplifiers are configured as open-loop transconductors and produce output currents that are substantially proportional to the differences of channel input voltages and the stored common maximum voltages.

The circuits described in this disclosure need no advance knowledge of a common baseline signal level of multiple channels, but adapt to find the baseline, in the form of the minimum or maximum of all the individual channel signal voltages, and tracks it as it changes with environmental conditions. This function is achieved with simple analog CMOS circuitry.

DETAILED DESCRIPTION OF A PREFERRED EMBODIMENT

Those of ordinary skill in the art will realize that the following description of the present invention is illustrative only and not in any way limiting. Other embodiments of the invention, such as a bipolar embodiment substituting PNP transistors for P-Channel MOS transistors and NPN transistors for N-Channel MOS transistors, will readily suggest themselves to such skilled persons.

Figure 1:
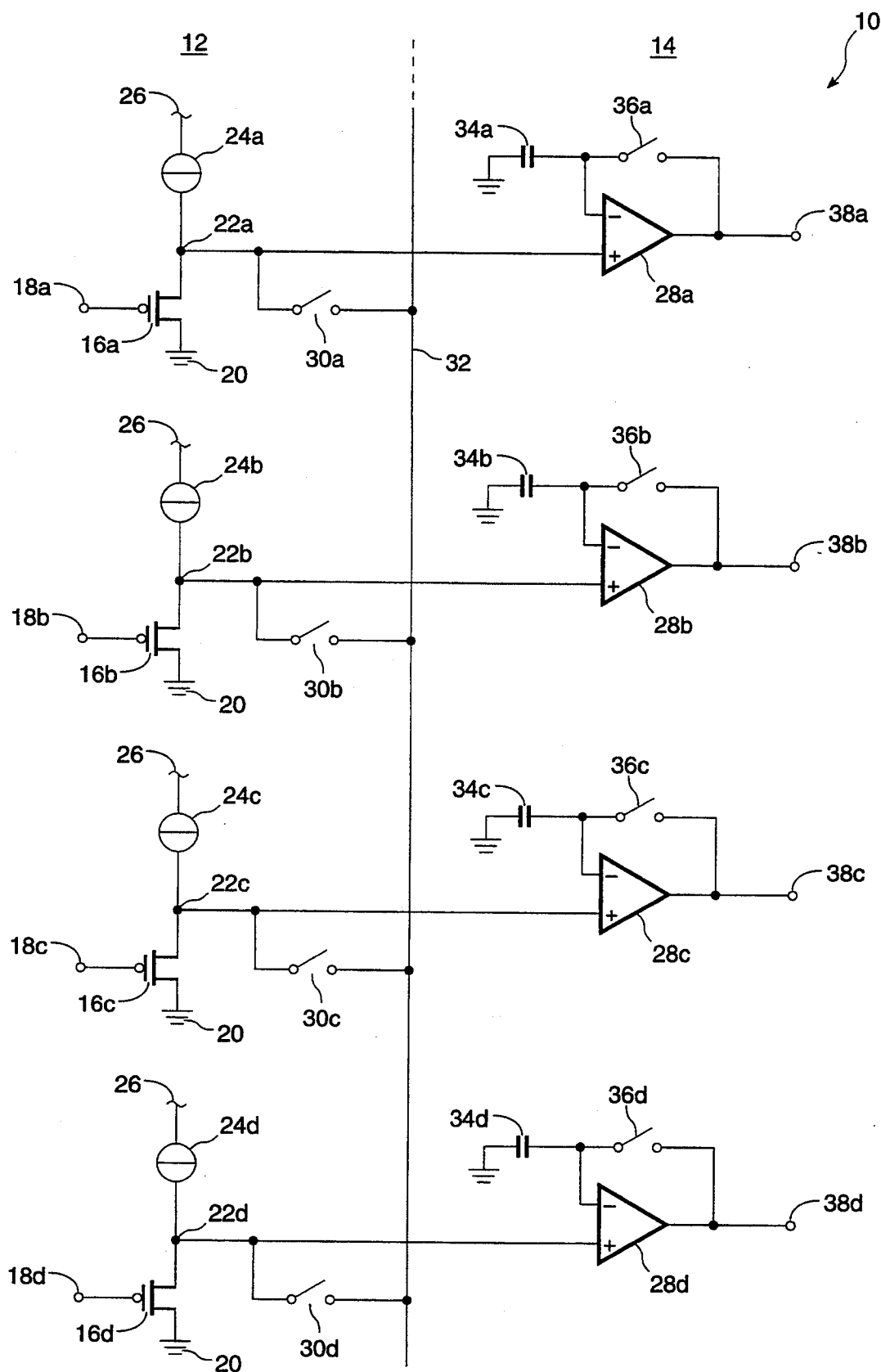
FIG. 1 is a schematic diagram of a first embodiment of an illustrative minimum selector and subtractor circuit according to the present invention, showing circuit details of four individual channels and their interconnection.

Referring first to FIG. 1 of the drawings, an illustrative four-channel minimum selector and subtractor circuit 10 of the present invention is shown. Each individual channel, even though constituting a single functional unit, can be thought of as consisting of a minimum selector circuit 12 and a subtractor circuit 14. In the minimum selector circuit 12, the active elements are P-channel MOS transistors $16a-16d$, each having its gate electrode connected to the channel input nodes $18a-18d$, its drain electrode connected to a negative fixed voltage source 20 such as ground, and its source electrode connected to an intermediate node $22a-22d$.

Each intermediate node $22a-22d$ is also connected to a current source $24a-24d$ that supplies the operating current of the P-channel MOS transistors $16a-16d$ from a fixed voltage source 26. Intermediate nodes $22a-22d$ are also connected to the non-inverting input of an operational transconductance amplifier $28a-28d$ (OTA), which comprises the heart of the subtractor circuit 14 of each channel. A first switch $30a-30d$ allows connecting the intermediate node $22a-22d$ to a minimum rail 32 which is common to all signal channels in the system. The inverting input of each OTA $28a-28d$ is connected to a storage capacitor $34a-34d$ as well as to one end of a second switch $36a-36d$ which permits selectively connecting the inverting input of the OTA $28a-28d$ to its output. The output of each OTA $28a-28d$ is connected to the output node $38a38d$ of its signal channel.

The minimum selector and subtractor circuit 10 of the present invention works in two distinct phases. In the first, or minimum select and storage phase, the switches $30a-30d$ and $36a-36d$ are closed. The source electrodes of N-channel MOS transistors $16a-16d$, intermediate nodes $22a-22d$, and non-inverting inputs of the OTAs $28a-28d$ in all channels are thus shorted together via the common minimum rail 32. Under this condition, the one of P-channel MOS transistors $16a-16d$ with the lowest gate potential will draw the largest current and will, if the input voltage differences are large enough, alone conduct the current from all the current sources $24a-24d$, rendering inactive the ones of P-channel MOS transistors $16a-16d$ of the other three channels. Thus the minimum rail 32 assumes a potential that is essentially the most negative (minimum) potential present among the channel input voltages, level-shifted up by one P-channel transistor $V_t$. Since each OTA $28a-28d$ is configured as a unity-gain voltage follower, it reproduces the voltage on the minimum rail 32 at its output and through the closed switch $36a-36d$ on the capacitor $34a-34d$.

In the second, or minimum subtraction phase, the switches $30a-30d$ and $36a-36d$ are opened. The individual channels are thus disconnected from each other, and the P-channel MOS transistor $16a-16d$ of each channel functions as a source follower, presenting the voltage at the channel input nodes $18a-18d$, level-shifted up by one P-channel transistor $V_t$, to the non-inverting inputs of OTAs $28a-28d$. At the same time, the capacitors $34a-34d$ are all storing the level-shifted minimum voltage as described above and presenting it to the inverting inputs of OTAs $28a-28d$. Because each OTA $28a-28d$ is now configured as an open-loop transconductor when its switch 36a–36d is opened, each OTA 28a–28d produces an output current substantially proportional to the difference between its channel's input voltage and the minimum of all channel input voltages.

Those of ordinary skill in the art will recognize that a very beneficial property of the minimum selector and subtractor circuit of the present invention is the fact that input offset voltage errors of the OTAs 28a–d, unavoidable in any physical system, are canceled because they affect the minimum storage and minimum subtraction modes of operation in exactly the same way. Such skilled persons will also recognize that while an illustrative four-channel embodiment of the invention has been disclosed, the number of channels to be employed in any actual design is somewhat arbitrary and depends on the particulars of the design.

Figure 2:
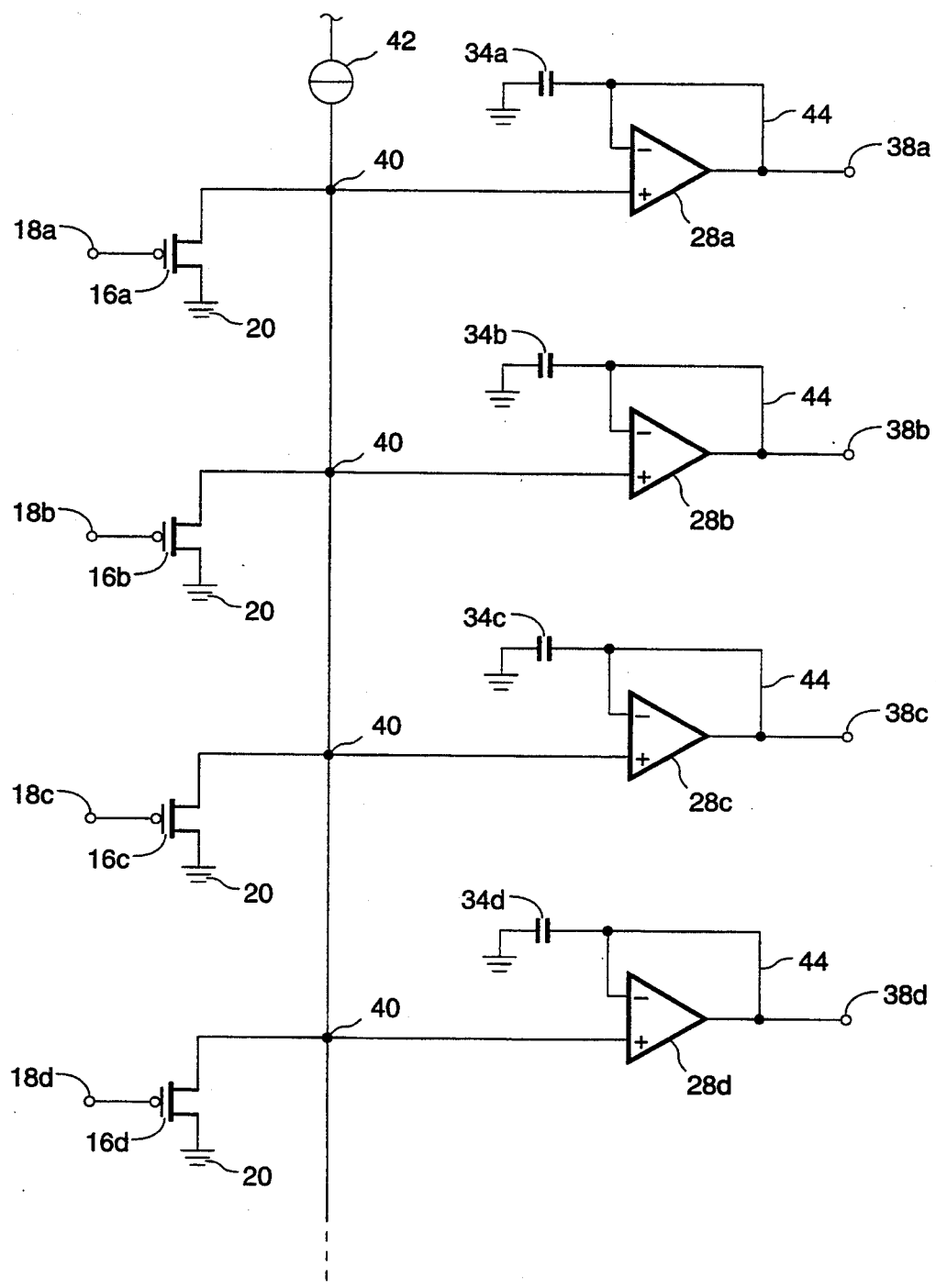
FIG. 2 is an equivalent schematic diagram of the minimum selector and subtractor circuit of FIG. 1 shown in its minimum-storage phase.

Referring now to FIG. 2, a simplified equivalent circuit diagram of the multi-channel minimum selector and subtractor circuit of the present invention is shown in the minimum select and storage phase. For clarity, the switches 30a–30d of FIG. 1, which are all closed in this phase, have been replaced by electrical shorts, and they as well as the intermediate nodes 22a–22d and the minimum rail 32 of FIG. 1 are shown as a single common node 40. Also all the current sources 24a–24d from FIG. 1, which in this phase of operation are shorted together, are shown in FIG. 2 as an equivalent current source 42, the current of which is equal to the sum of all the individual current sources 24a–24d. Together the P-channel MOS field effect transistors 16a–16d and the current source 42 form a minimum selector circuit as described above, i.e. the one of P-channel MOS transistors 16a–16d with the lowest gate voltage (the minimum input voltage) draws substantially all available current, and the common node 40 assumes a potential about one P-channel transistor $V_t$ above the minimum input voltage.

Referring still to FIG. 2, feedback connections 44 are drawn in place of switches 36a–36d in FIG. 1, since the switches are all closed in this phase of operation. To persons of ordinary skill in the art, it is obvious that the OTAs 28a–28d are connected as unity-gain voltage followers, impressing their input voltages, which are all identical to the minimum voltage on node 40, onto storage capacitors 34a–34d.

Figure 3:
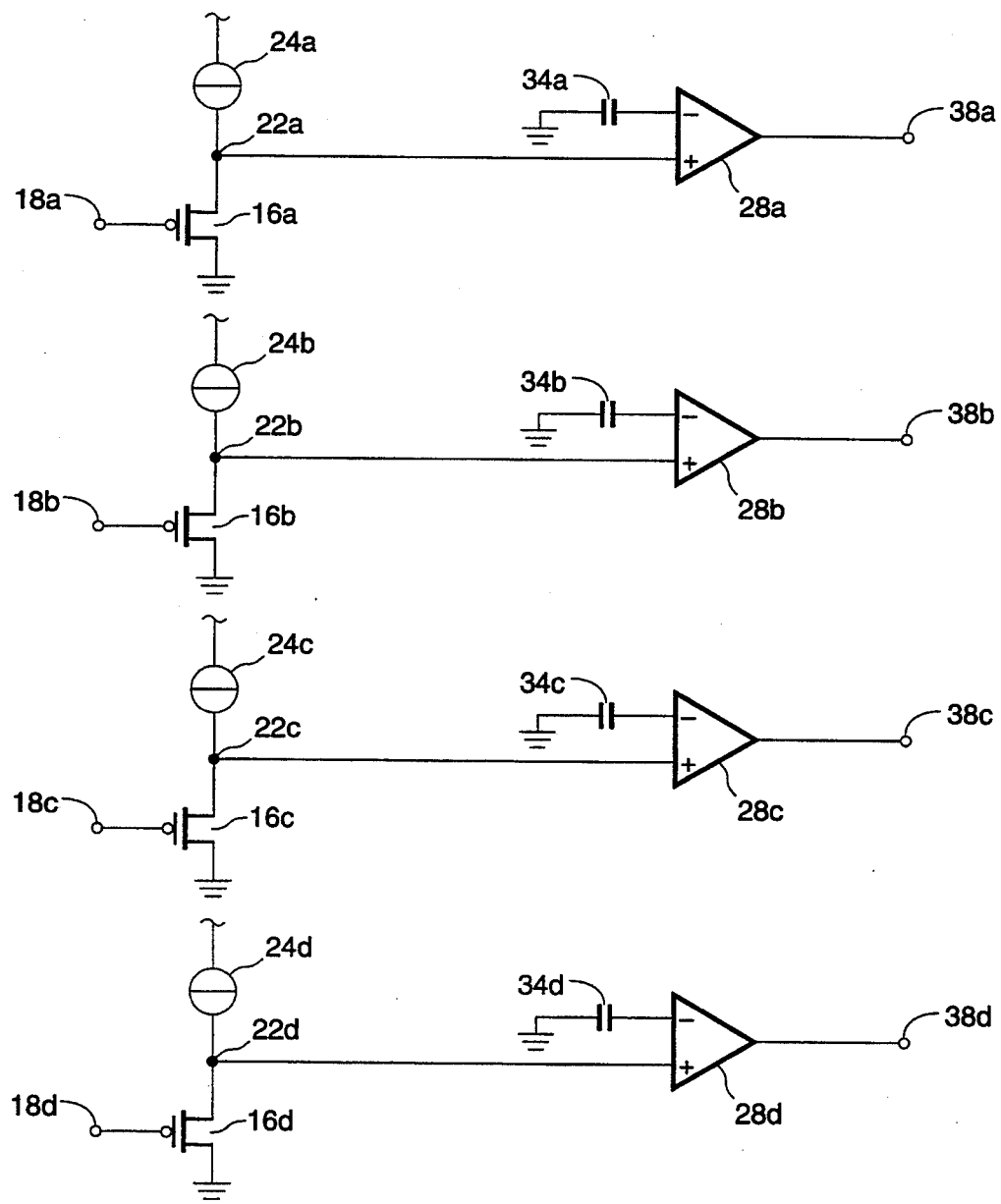
FIG. 3 is an equivalent schematic diagram of the minimum selector and subtractor circuit of FIG. 1 shown in its minimum subtraction phase.

Referring now to FIG. 3, an equivalent and simplified circuit diagram of the same four-channel minimum selector and subtractor circuit 10 of FIG. 1 is shown in its minimum subtract phase. For clarity, the switches 30a–30d of FIG. 1, which are all open in this phase, as well as the minimum rail 32 which is disconnected from the rest of the circuitry in this phase, have been omitted from the drawing. It will be clear to persons of ordinary skill in the art that together the P-channel MOS field effect transistors 16a–16d and the current sources 24a'24d form source follower circuits as described above, i.e. that each transistor delivers the input voltage of its channel from nodes 18a–18d, level-shifted up by a P-channel transistor $V_t$, to its associated OTA 28a–28d via its intermediate node 22a–22d.

Referring still to FIG. 3, the switches 36a–36d of FIG. 1, which are all open in this phase of operation, have been omitted from the drawing to clarify the operation of the OTAs as open-loop transconductors that produce an output current proportional to the potential difference across their input terminals. In all cases this potential difference is substantially equal to the difference between the channel input voltage and the minimum of all channel input voltages, since the level-shifted input voltages are present at the non-inverting input terminals while the stored level-shifted minimum voltages are present at the inverting input terminals.

The switches 30a–30d and 36a–36d could in principle be implemented as mechanical switches or electromechanical relays, but according to a presently preferred embodiment of the invention, these switches are in the form of complementary MOS field effect transistor switches, well known to persons of ordinary skill in the art. As is apparent, employment of such switches would allow faster operation and would also permit the circuit to be entirely implemented as an integrated circuit.

In some operating environments, it would be desirable to employ a circuit having the capability of rejecting or at least attenuating negative peaks on the input voltages. This is a desirable property in applications where it is expected that several or most channel input voltages are always equal to a common minimum or baseline potential, but considerable noise on the inputs may create false single-channel minimum peaks.

Figure 4:
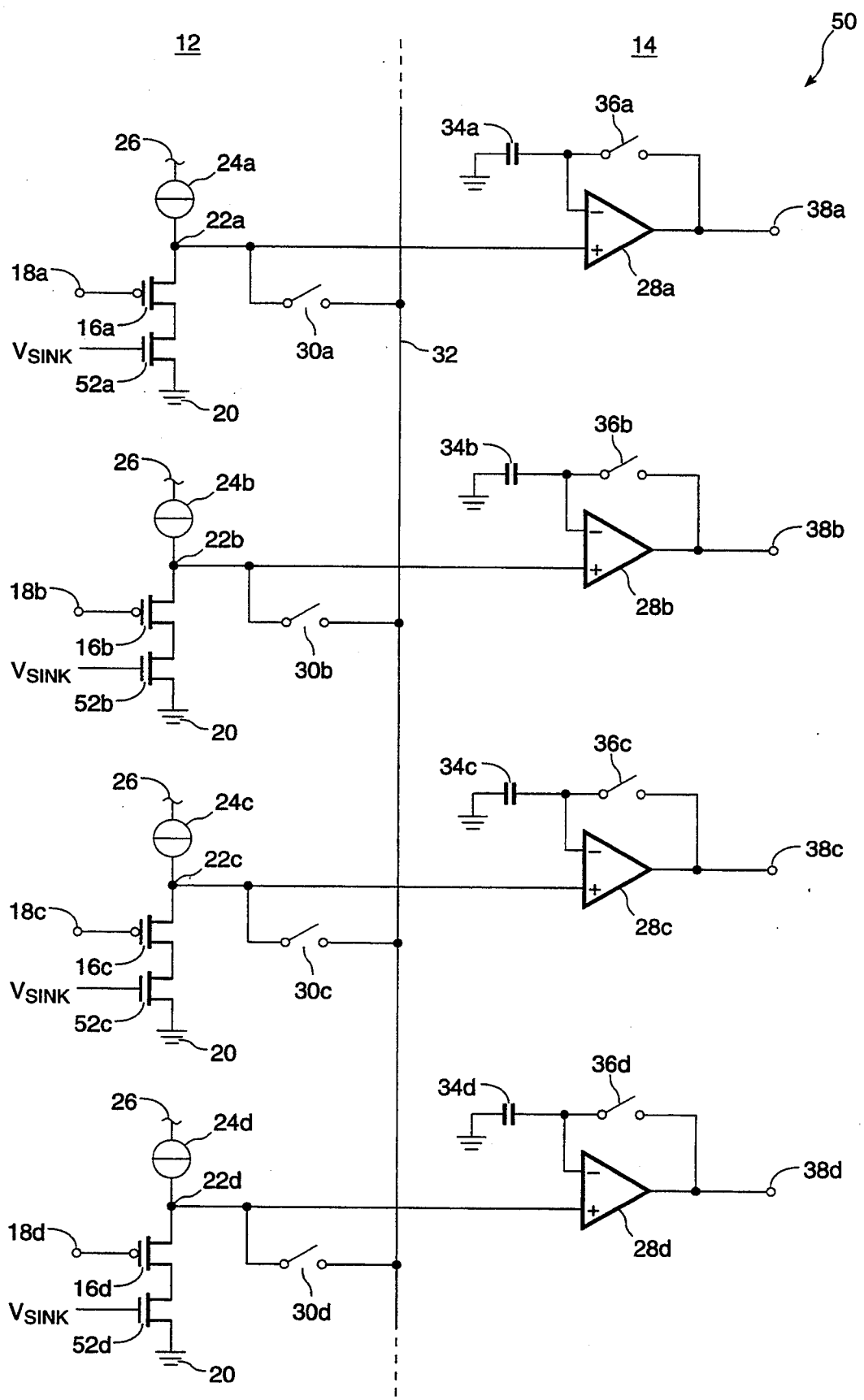
FIG. 4 is a schematic diagram of an illustrative minimum selector and subtractor circuit including peak rejection according to the present invention, showing circuit details of four individual channels and their interconnection.

Referring now to FIG. 4, a schematic diagram of an alternate embodiment of a minimum selector and subtractor circuit 50 of the present invention is shown. The circuit of FIG. 4 is similar to the circuit of FIG. I and the same reference numerals will be employed in FIGS. 1 and 4 to represent the same elements.

Like the circuit of FIG. 1, the circuit of FIG. 4 can be thought of as comprising a minimum selector circuit 12 and a subtractor circuit 14. Also, like the circuit shown in FIG. 1, the active elements in the minimum selector circuit are P-channel MOS transistors 16a–16d with their gate electrodes connected to the channel input nodes 18a–18d, respectively, and their source electrodes connected to intermediate nodes 22a–22d, respectively. These intermediate nodes 22a–22d are connected to current sources 24a–24d, respectively to supply the operating current of the transistors. Switches 30a–30d may be used to selectively connect intermediate nodes 22a–22d to minimum rail 32.

The intermediate nodes 22a–22d are further connected to the non-inverting inputs of OTAs 28a–28d, respectively, and the outputs of OTAs 28a–28d are connected to output nodes 38a–38d. Switches 36a–36d are used to selectively connect the outputs of the OTA circuits to their inverting inputs. Capacitors 34a–34d are connected between the inverting inputs of their respective OTA circuits and a fixed voltage potential, shown as ground.

Unlike in the minimum selector and subtractor circuit of FIG. 1, the drain electrodes of transistors 16a–16d in the minimum selector and subtractor circuit of FIG. 4 are connected to the drain electrodes of N-channel MOS current-limiting transistors 52a–52d, respectively. N-channel MOS transistors 52a–52d have their source electrodes connected to a fixed voltage 20, such as ground, and their gate electrodes held at a potential above (more positive than) their source electrodes such that they function as current sinks with limited voltage compliance. The gate voltage of the current-limiting transistors is selected to set their saturation current to be N n ths of the value of the current source 24, where N is the number of channels present in the system and n is the number of channels to be averaged over to obtain the minimum.

The addition of current sink transistors 52a–52d have the effect of limiting the current that any one of the P-channel MOS transistors 16a–16d can draw. As is well known to those of ordinary skill in the art, this is because the common drain connections of the N-channel and P-channel MOS transistors will assume such a potential as to reduce the drain-to-source voltage difference of one or the other of the two transistors far enough to prevent it from drawing more current than the other transistor allows to flow.

If the sink current of transistors 52a–52d is chosen to be larger than the current of sources 24a–24d but smaller than the sum of all source currents, then no single transistor 16a–16d can conduct all the current in the minimum selection phase of operation. Instead, several transistors have to share it. Thus it may be seen that the minimum select and subtractor circuit of FIG. 4 selects not the absolute minimum of the input voltages of all channels, but rather an average of the several lowest input voltages from among all channels.

For example, assuming an embodiment including 15 identical signal channels, and the currents of the N-channel MOS transistors in each channel are 5 times larger than the currents of current sources 24, then the three P-channel transistors with the lowest gate potentials must share the total system current because the total is equal to 15 times the source current. The effect is to reject or at least attenuate negative peaks on the input voltages. This property is highly desirable in applications where it is expected that several or most channel input voltages will always be equal to a common minimum or baseline potential, but considerable noise existing on the inputs may create false negative peaks.

According to another aspect of the present invention, a maximum selector and subtractor circuit is presented. The operation of such a circuit is similar to the operation of the previously described minimum selector and subtractor circuit, except that the circuit responds to the maximum rather than the minimum value appearing on one of a plurality of inputs, and computes the difference between the maximum value and each of the individual input values.

Figure 5:
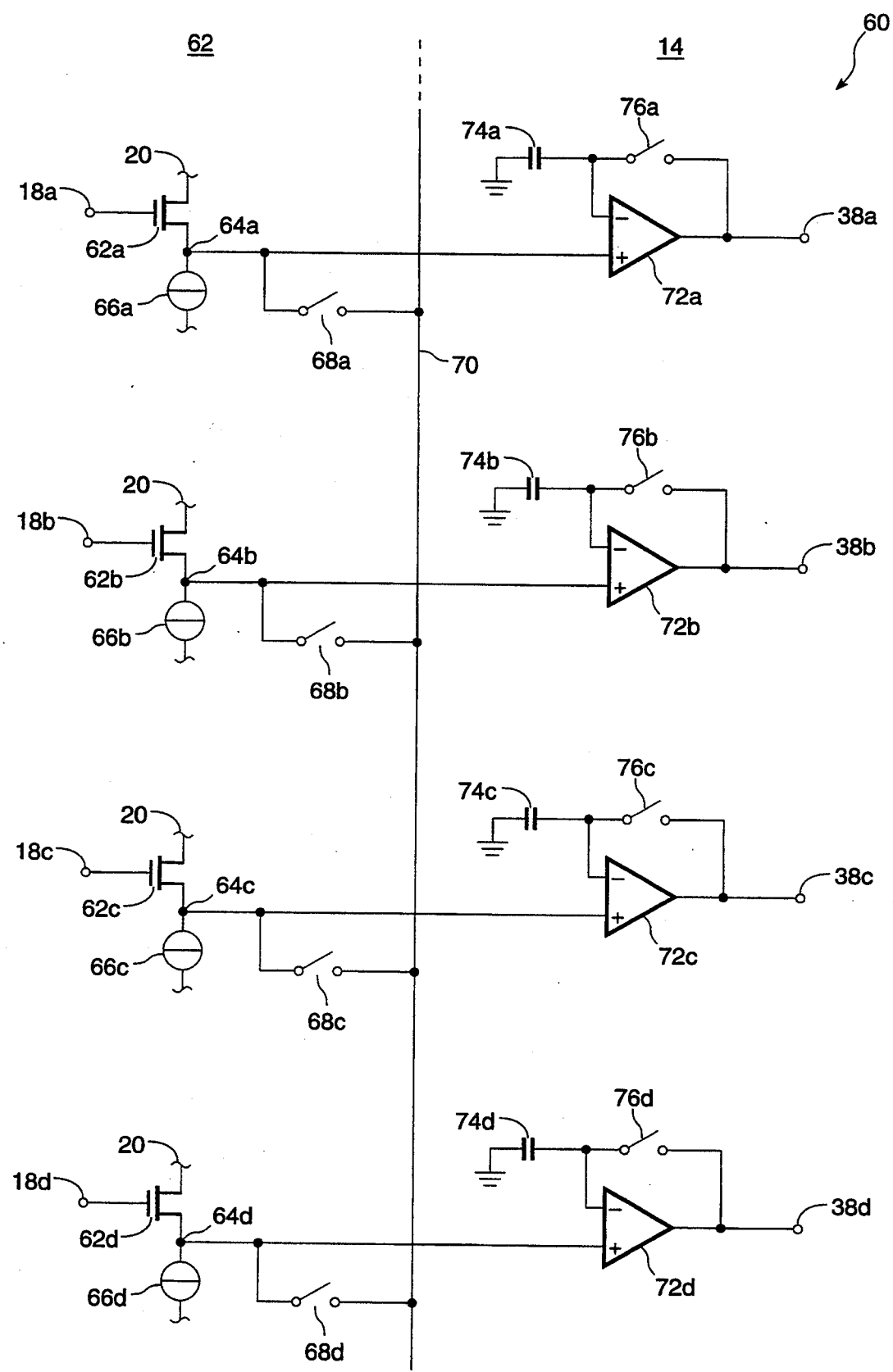
FIG. 5 is a schematic diagram of a first embodiment of an illustrative maximum selector and subtractor circuit according to the present invention, showing circuit details of four individual channels and their interconnection.

Referring now to FIG. 5, a four-channel maximum selector and subtractor circuit 60 is shown in schematic diagram form. Maximum selector and subtractor circuit 60 comprises a maximum selector circuit 62 and a subtractor circuit 14. Those of ordinary skill in the art will recognize that subtractor circuit 14 is identical to the subtractor circuit portions of the minimum selector and subtractor circuits of FIGS. 1 and 4.

In the illustrative four-channel example of the maximum selector circuit 60 of FIG. 5, the active elements for the individual channels are N-channel MOS transistors 62a–62d, each having its gate electrode connected to one of channel input nodes 18a–18d, its drain electrode connected to a fixed voltage potential 20 such as the positive supply voltage, and its source electrode connected to respective intermediate nodes 64a–64d. Intermediate nodes 64a–64d are also connected to respective current sinks 66a–66d which supply the operating current of their respective transistors 62a–62d. First switches 68a–68d may be used to selectively connect the intermediate nodes 64a–64d to a maximum rail 70 which is common to all signal channels in the four-channel illustrative circuit shown.

Intermediate nodes 64a–64d are further connected to the non-inverting input of respective OTAs 72a–72d. Capacitors 74a–74d are connected between the inverting inputs of the OTAs 72a–72d and a fixed voltage source such as ground. Second switches 76a–76d may be used to selectively connect the outputs of OTAs 72a–72d to their inverting inputs.

Like the minimum selector and subtractor circuits of FIGS. 1 and 4, the maximum selector and subtractor circuit 60 of the present invention operates in two phases. In the first, or maximum select and storage phase, the switches 68a–68d and 76a–76d are closed. The source electrodes of P-channel MOS transistors 62a–62d, intermediate nodes 64a–64d, and non-inverting inputs of the OTAs 72a–72d in all channels are thus shorted together via the common maximum rail 70. Under this condition, the one of N-channel MOS transistors 62a–62d with the highest gate potential carries the largest current and will, if the input voltage differences are large enough, alone conduct the current from all the current sinks 66a–66d, while the N-channel MOS transistors 62a–62d of the other three channels remain turned off. Thus the maximum rail 70 assumes a potential that is essentially the most positive (maximum) potential present among the channel input voltages, level-shifted down by one N-channel transistor $V_t$. Since each OTA 72a–72d is configured as a unity-gain voltage follower, it reproduces the voltage on the maximum rail 70 at its output and through the closed switch 76a–76d on the capacitors 74a–74d.

In the second, or maximum subtraction phase, the switches 68a–68d and 76a–76d are opened. The individual channels are thus disconnected from each other, and the N-channel MOS transistor 62a–62d of each channel functions as a source follower, presenting the voltage at the channel input nodes 18a–18d, level-shifted down by one N-channel transistor $V_t$, to the non-inverting inputs of OTAs 72a–72d. At the same time, the capacitors 74a–74d are all storing the level-shifted maximum voltage as described above. This voltage is presented to the inverting inputs of OTAs 72a–72d. Because each OTA 72a–72d is now configured as an open-loop transconductance amplifier when its switch 74a–74d is opened, each OTA 72a–72d produces an output current substantially proportional to the difference between its channel's input voltage and the maximum of all channel input voltages.

Figure 6:
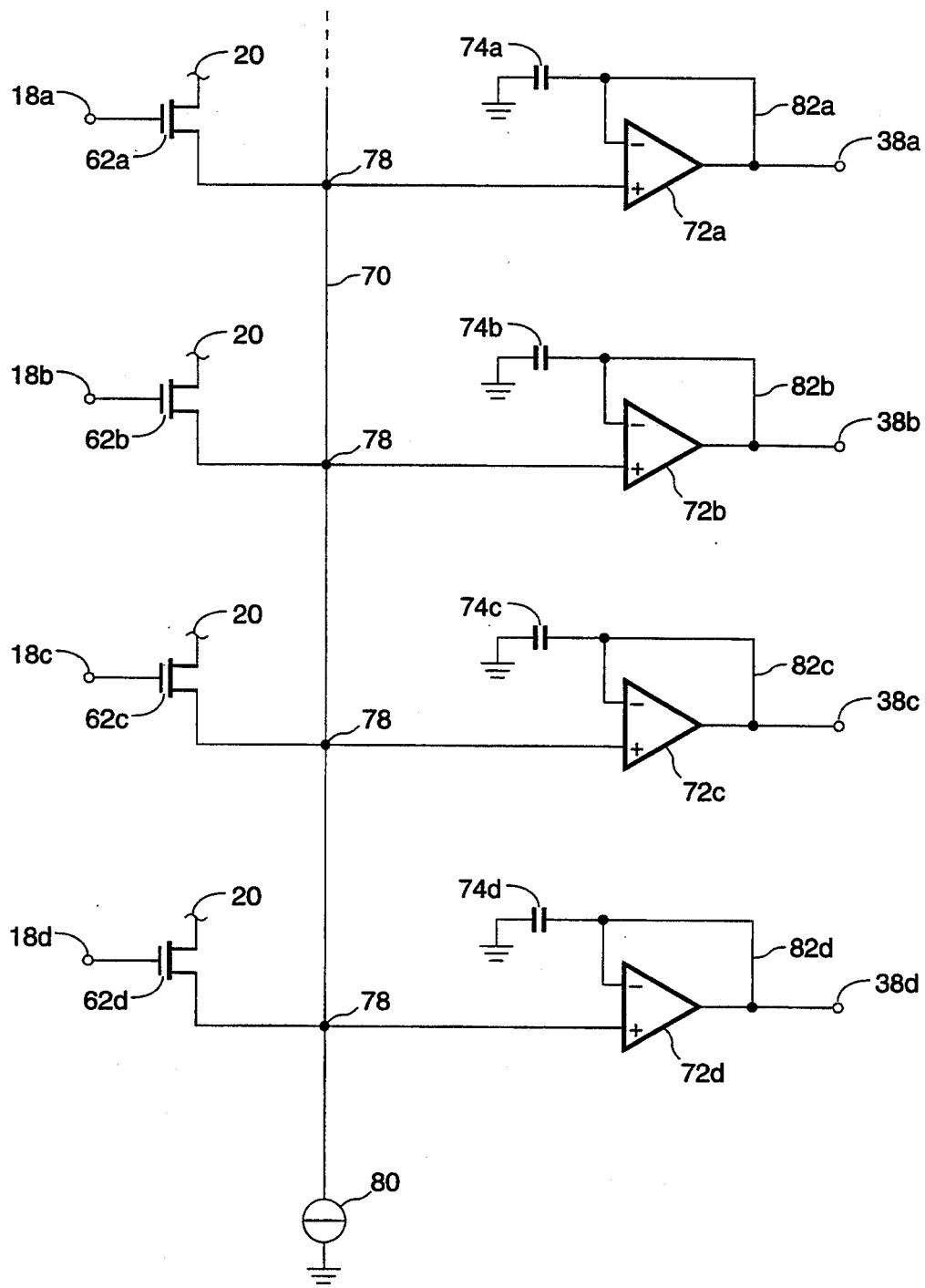
FIG. 6 is an equivalent schematic diagram of the maximum selector and subtractor circuit of FIG. 5 shown in its maximum-storage phase.

Referring now to FIG. 6 of the drawings, an equivalent schematic diagram of the circuit of FIG. 5 is shown during the first operating phase of the maximum selector and subtractor circuit of the present invention. Since switches 68a–68d are all closed, they are represented as hardwired connections coupling all of the sources of N-channel MOS transistors 62a–62d to the common maximum rail 70 through a common node 78 fed by a common current sink 80, which is the equivalent of the four current sinks 66a–66d. Switches 76a–76d are represented as hardwired feedback connections 80a–80d from the output of each OTA 72a–72d to its non-inverting input. During this phase, the computed maximum value is stored on capacitors 74a–74d.

Figure 7:
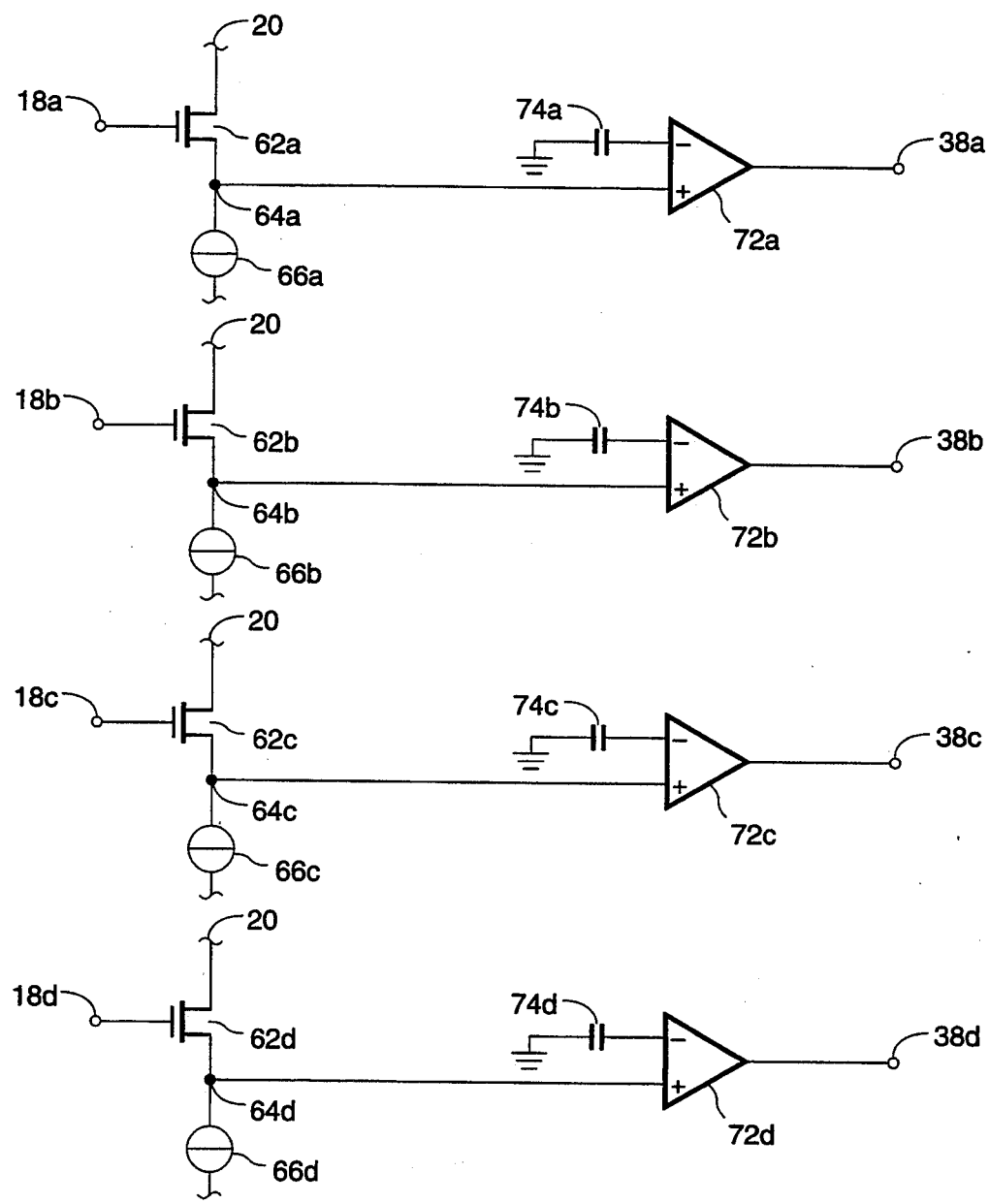
FIG. 7 is an equivalent schematic diagram of the maximum selector and subtractor circuit of FIG. 5 shown in its maximum subtraction phase.

FIG. 7 is an equivalent schematic diagram of the maximum selector and subtractor circuit during the second phase of circuit operation. During the second operating phase, switches 68a–68d are in their opened state. The sources of the individual N-channel MOS transistors are connected to intermediate nodes 64a–64d and there are no feedback loops around any of the OTAs 72a–72d. It will be clear to persons of ordinary skill in the art that together the N-channel MOS field effect transistors 62a–62d and their associated current sinks 66a–66d form source follower circuits. Each N- channel MOS transistor 62a–62d delivers the input voltage of its channel from input nodes 18a–18d, level-shifted down by an N-channel MOS transistor $V_t$, to its associated OTA 72a–72d via its intermediate node 64a–64d.

Figure 8:
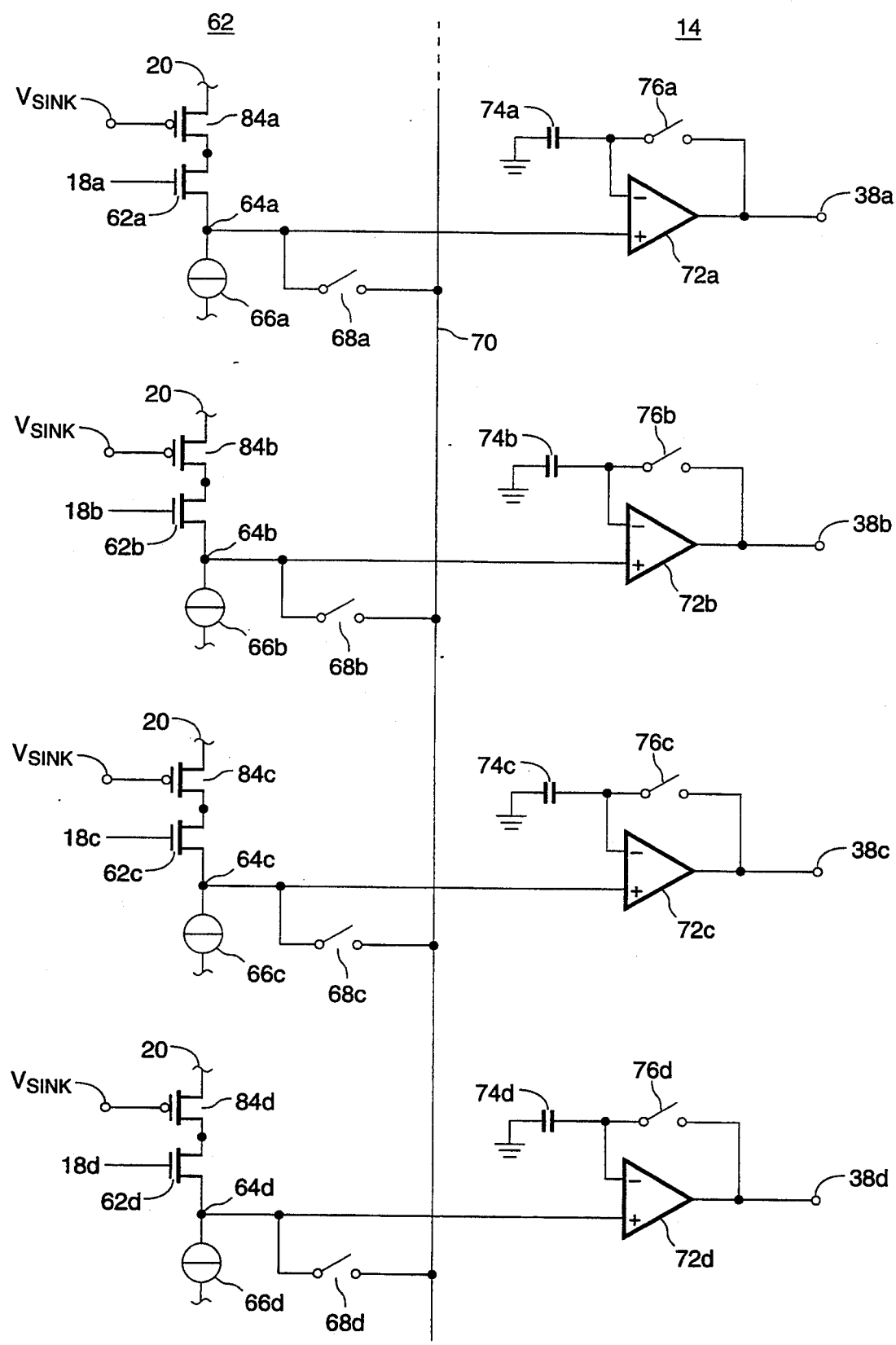
FIG. 8 is a schematic diagram of an illustrative maximum selector and subtractor circuit including peak rejection according to the present invention, showing circuit details of four individual channels and their interconnection.

Referring now to FIG. 8, an alternative embodiment of the maximum selector and subtractor circuit of the present invention is depicted. As in the embodiment illustrated in FIG. 5, the active element of each of the four channels includes N-channel MOS transistors 62a–62d, each having its gate connected to a different one of input nodes 18a–18d, and each having its source connected to a different one of intermediate nodes 64a–64d. Switches 68a–68d connect intermediate nodes 64a–64d to a common node 70. Intermediate nodes 64a–64d are also each connected to the non-inverting input of a different one of OTAs 72a–72d.

Unlike in the circuit shown in FIG. 5, the drain electrodes of transistors 62a–62d are each connected to the drain electrode of one of P-channel MOS current-limiting transistors 84a–84d. P-channel MOS transistors 84a–84d have their source electrodes connected to a positive fixed voltage source 20 such as the positive supply voltage and each has its gate electrode held at a potential $V_{sink}$ below (more negative than) its source electrode such that P-channel MOS transistors 84a–84d function as current sources with limited voltage compliance.

The addition of P-channel MOS current source transistors 84a–84d has the effect of limiting the current that any one of N-channel MOS transistors 62a–62d can draw. This is because, as is well known to those of ordinary skill in the art, the common drain node in each channel will assume such a potential as to reduce the drain-to-source voltage difference of one or the other of N-channel MOS transistors 62a–62d and P-channel MOS transistors 84a–84d far enough to prevent it from drawing more current than the other transistor allows to flow.

If the current of P-channel MOS source transistors 84a–84d is chosen to be larger than the current of sinks 66a–66d but smaller than the sum of all sink currents, then no single N-channel MOS transistor 62a–62d can conduct all the current in the maximum selection phase of operation, but several transistors have to share it. Thus this modified circuit selects not the absolute maximum of the input voltages of all of the channels but rather an average of the highest input voltages of several channels. For example, assuming there are 15 identical signal channels, and the currents of P-channel MOS source transistors 84a–84d are 5 times larger than the currents of sinks 66a–66d, then the 3 of N-channel MOS transistors 62a–62d with the highest gate potentials must share the total system current because the total is equal to 15 sink currents. This has the effect of rejecting or at least attenuating positive peaks on the input voltages—a desirable property in applications where one expects that several or most channel input voltages are always equal to a common maximum or baseline potential, but considerable noise on the inputs may create false positive peaks.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A multi-channel minimum selector and subtractor circuit, including:
    a plurality of input nodes;
    a plurality of output nodes;
    a plurality of current sources
    a common conductive line;
    a plurality of P-Channel MOS transistors, each of said P-Channel MOS transistors having a gate connected to a different one of said input nodes, a source connected to a different one of said current sources, and a drain connected to a fixed voltage source at a potential more negative than the potential at said source of said P-Channel MOS transistor;
    a plurality of first switches, each of said first switches connected between said common conductive line and the source of one of a different one of said P-Channel transistors;
    a plurality of transconductance amplifiers, each of said transconductance amplifiers having an output connected to a different one of said output nodes, an inverting input, and a non-inverting input connected to the source of a different one of said P-Channel MOS transistors;
    a plurality of capacitors, each of said capacitors connected between a fixed voltage source and the inverting input of a different one of said transconductance amplifiers;
    a plurality of second switches, each of said second switches connected between the output and the inverting input of a different one of said transconductance amplifiers; and
    means for closing all of said first and second switches during a first operating phase of said minimum selector and subtractor circuit, and for opening all of said first and second switches during a second operating phase of said minimum selector and subtractor circuit.

2. A multi-channel minimum selector and subtractor circuit, including:
    a plurality of input nodes;
    a plurality of output nodes;
    a plurality of current sources
    a common conductive line;
    a plurality of P-Channel MOS transistors, each of said P-Channel MOS transistors having a gate connected to a different one of said input nodes, a source connected to a different one of said current sources, and a drain;
    a plurality of N-Channel MOS transistors, each of said P-Channel MOS transistors having a drain connected to the drain of said P-Channel MOS transistor, a source connected to a fixed voltage source and a gate connected to a current limit bias source;
    a plurality of first switches, each of said first switches connected between said common conductive line and the source of one of a different one of said P-Channel transistors;
    a plurality of transconductance amplifiers, each of said transconductance amplifiers having an output connected to a different one of said output nodes, an inverting input, and a non-inverting input connected to the source of a different one of said P-Channel MOS transistors;
    a plurality of capacitors, each of said capacitors connected between a fixed voltage source and the inverting input of a different one of said transconductance amplifiers;

a plurality of second switches, each of said second switches connected between the output and the inverting input of a different one of said transconductance amplifiers; and means for opening all of said first and second switches during a first operating phase of said minimum selector and subtractor circuit, and for closing all of said first and second switches during a second operating phase of said minimum selector and subtractor circuit.

3. A multi-channel maximum selector and subtractor circuit, including:

a plurality of input nodes;

a plurality of output nodes;

a plurality of current sinks a common conductive line;

a plurality of N-Channel MOS transistors, each of said N-Channel MOS transistors having a gate connected to a different one of said input nodes, a source connected to a different one of said current sinks, and a drain connected to a fixed voltage source at a potential more positive than the potential at said source of said N-Channel MOS transistor;

a plurality of first switches, each of said first switches connected between said common conductive line and the source of one of a different one of said N-Channel transistors;

a plurality of transconductance amplifiers, each of said transconductance amplifiers having an output connected to a different one of said output nodes, an inverting input, and a non-inverting input connected to the source of a different one of said N-Channel MOS transistors;

a plurality of capacitors, each of said capacitors connected between a fixed voltage source and the inverting input of a different one of said transconductance amplifiers;

a plurality of second switches, each of said second switches connected between the output and the inverting input of a different one of said transconductance amplifiers; and means for closing all of said first and second switches during a first operating phase of said maximum selector and subtractor circuit, and for opening all of said first and second switches during a second operating phase of said maximum selector and subtractor circuit.

4. A multi-channel maximum selector and subtractor circuit, including:

a plurality of input nodes;

a plurality of output nodes;

a plurality of current sinks;

a common conductive line;

a plurality of N-Channel MOS transistors, each of said N-Channel MOS transistors having a gate connected to a different one of said input nodes, a source connected to a different one of said current sinks, and a drain;

a plurality of P-Channel MOS current-limiting transistors, each of said P-Channel MOS transistors having a drain connected to the drain of said N-Channel MOS transistor, a source connected to a fixed voltage source and a gate connected to a current-limit bias source;

a plurality of first switches, each of said first switches connected between said common conductive line and the source of one of a different one of said P-Channel transistors;

a plurality of transconductance amplifiers, each of said transconductance amplifiers having an output connected to a different one of said output nodes, an inverting input, and a non-inverting input connected to the source of a different one of said P-Channel MOS transistors;

a plurality of capacitors, each of said capacitors connected between a fixed voltage source and the inverting input of a different one of said transconductance amplifiers;

a plurality of second switches, each of said second switches connected between the output and the inverting input of a different one of said transconductance amplifiers; and means for closing all of said first and second switches during a first operating phase of said maximum selector and subtractor circuit, and for opening all of said first and second switches during a second operating phase of said maximum selector and subtractor circuit.

* * * * *

UNITED STATES PATENT AND TRADEMARK OFFICE
CERTIFICATE OF CORRECTION

PATENT NO. : 5,408,194
DATED : April 18, 1995
INVENTOR(S) : Günter Steinbach, Timothy P. Allen, Carver A. Mead It is certified that error appears in the above-indentified patent and that said Letters Patent is hereby corrected as shown below:

Column 4, line 33, replace "38a38d" with --38a-38d--.

Column 4, line 41, replace "28a--28d" with --28a-28d--.

Column 5, line 56, replace "24a'24d" with --24a-24d--.

Column 6, line 26, replace "FIG. I" with --FIG. 1--.

Signed and Sealed this

Thirtieth Day of April, 1996

Attest:

BRUCE LEHMAN

*Attesting Officer*  *Commissioner of Patents and Trademarks*